US011680998B2

(12) United States Patent
Chen et al.

(10) Patent No.: US 11,680,998 B2
(45) Date of Patent: Jun. 20, 2023

(54) NMR RELAXATION TIME INVERSION METHOD BASED ON UNSUPERVISED NEURAL NETWORK

(71) Applicant: INNOVATION ACADEMY FOR PRECISION MEASUREMENT SCIENCE AND TECHNOLOGY, CAS, Wuhan (CN)

(72) Inventors: Li Chen, Wuhan (CN); Sheng Shen, Wuhan (CN); Junfei Chen, Wuhan (CN); Fang Chen, Wuhan (CN); Chaoyang Liu, Wuhan (CN)

(73) Assignee: INNOVATION ACADEMY FOR PRECISION MEASUREMENT SCIENCE AND TECHNOLOGY, CAS

( * ) Notice: Subject to any disclaimer, the term of this patent is extended or adjusted under 35 U.S.C. 154(b) by 0 days.

(21) Appl. No.: 17/945,120

(22) Filed: Sep. 15, 2022

(65) Prior Publication Data

US 2023/0140265 A1 May 4, 2023

Related U.S. Application Data

(63) Continuation of application No. PCT/CN2021/129050, filed on Nov. 5, 2021.

(30) Foreign Application Priority Data

Nov. 3, 2021 (CN) .......................... 202111292003.3

(51) Int. Cl.
*G01R 33/46* (2006.01)
*G06N 3/088* (2023.01)
*G06N 3/04* (2023.01)

(52) U.S. Cl.
CPC ........... *G01R 33/4625* (2013.01); *G06N 3/04* (2013.01); *G06N 3/088* (2013.01)

(58) Field of Classification Search
CPC ....... G01R 33/4625; G06N 3/04; G06N 3/088
See application file for complete search history.

(56) References Cited

U.S. PATENT DOCUMENTS 10,546,237 B2 * 1/2020 Heifets ................. G06F 18/214
11,122,778 B2 * 9/2021 Haase ................. G01R 33/4835

FOREIGN PATENT DOCUMENTS

CN  107728231 A  2/2018
CN  111898734 A  11/2020

OTHER PUBLICATIONS

Dong Liang, et al., Deep Magnetic Resonance Image Reconstruction Inverse problems meet neural networks, IEEE Signal Processing Magazine, 2020, pp. 141-151.

* cited by examiner

*Primary Examiner* — Mohammad K Islam
(74) *Attorney, Agent, or Firm* — Bayramoglu Law Offices LLC

(57) ABSTRACT

An NMR relaxation time inversion method based on an unsupervised neural network includes simulating inversion kernel matrix, simulating continuous NMR relaxation time spectrum, simulating noise, calculating NMR relaxation signals as samples, various samples forming a sample set, constructing an unsupervised neural network model, and defining a loss function of the unsupervised neural network model; and taking the samples in the training sample set as an input of the unsupervised neural network model, to obtain an optimal mapping relationship between the NMR relaxation signals and the NMR relaxation time spectrum with a minimum loss function. The present invention provides the possibility of using experimental data as the sample for (Continued)

training since the trading sample does not need to be labeled, can automatically learn the optimal regularization parameters without depending on the initial value and manual experience, and predicts fast.

5 Claims, 2 Drawing Sheets

NMR RELAXATION TIME INVERSION METHOD BASED ON UNSUPERVISED NEURAL NETWORK

CROSS REFERENCE TO THE RELATED APPLICATIONS

This application is a continuation application of the International Application No. PCT/CN2021/129050, filed on Nov. 5, 2021, which is based upon and claims priority to Chinese Patent Application No. 202111292003.3, filed on Nov. 3, 2021, the entire contents of which are incorporated herein by reference.

TECHNICAL FIELD

The present invention belongs to the technical field of nuclear magnetic resonance, in particular to an NMR relaxation time inversion method based on an unsupervised neural network.

BACKGROUND

The NMR relaxation time is a key parameter describing the dynamics of the spins under investigation and its interaction with the surrounding environment. There are two kinds of NMR relaxation time commonly used in the research: longitudinal (spin-lattice) relaxation time $T_1$ and transverse (spin-spin) relaxation time $T_2$. For simple NMR samples (such as pure water), the relaxation process is in a form of a single exponential time-varying function, and the relaxation times ($T_1$ and $T_2$) of the samples are easily analyzed as single components. However, if the sample under investigation contains a variety of substance components or a complex system with uneven local microenvironment inside the sample, the NMR relaxation process of samples is no longer a simple single exponential time-varying function, but a complex form of multi-exponential time-varying function. The NMR relaxation time analysis of complex system is much more complicated and difficult, so the relaxation time of each component (also called NMR relaxation time spectrum, $T_1$ spectrum, $T_2$ spectrum) can be obtained by suitable and specific NMR relaxation time inversion method, and the substance characteristics and kinetic information corresponding to each component of the studied sample can be analyzed and understood.

Currently, the NMR relaxation time spectrum correlation technology has been widely used in many fields such as petroleum, chemical industry, food, agriculture, medicine, materials and so on. The traditional method of obtaining NMR relaxation time spectrum is usually Laplace inversion of the original spin relaxation signal, which is an ill-conditioned algorithm. Because of the small noise in the original spin relaxation signal, the inversion results may change greatly, which makes the relaxation time spectrum uncertain. Traditional inversion methods can be divided into linear inversion methods and nonlinear inversion methods. Linear inversion methods are mainly truncated singular value decomposition and Tikhonov regularization method. Nonlinear inversion methods include Monte Carlo method and maximum entropy method. Linear inversion methods usually employ non-negative regularization to constrain the amplitude and shape of the solution to reduce the uncertainty of the solution, but the solution is sensitive to the regularization term parameters, depends on prior information, and needs to be adjusted manually. Nonlinear inversion methods usually use multiple iterations to find the global minimum of the objective function, and the operation speed of this kind of methods is very slow.

Recently, deep learning network has been used to solve this kind of inversion problem. The supervised training of deep neural network (STD) with reference data is used to obtain the relaxation time spectrum. This method does not need to adjust the regularization parameters manually. Compared with traditional methods, this method reduces the dependence on regularization parameters. However, the STD training needs to refer to the relaxation time spectrum as a label. If the experimental data is used as the training data, it is almost impractical to make the label.

The present invention provides an unsupervised training of deep neural network (UTD) to solve the above problem. It is called unsupervised learning to solve various problems in pattern recognition based on unknown (unlabeled) training samples. A neural network trained by the unlabeled training samples is an unsupervised neural network. The present invention trains the neural network using unlabeled NMR relaxation signals as training samples and using a forward problem as a loss function during training. The present invention can train the network without reference to the NMR relaxation time spectrum as a label, and the network learns the regularization parameters autonomously, thereby further reducing the dependence on the parameters

SUMMARY

In view of the defects existing in the prior art, the present invention aims to provide an NMR relaxation time inversion method based on an unsupervised neural.

In order to achieve the above purpose, the present invention adopts the following technical measures:

an NMR relaxation time inversion method based on an unsupervised neural network, including:

step 1, simulating inversion kernel matrix K, simulating continuous NMR relaxation time spectrum F, simulating noise ε, calculating NMR relaxation signals $\mathcal{M}$ according to $\mathcal{M}=KF+ε$ as samples, various samples forming a sample set, and dividing the sample set into a training sample set and a test sample set;

step 2, constructing an unsupervised neural network model, and defining a loss function of the unsupervised neural network model as:

$$\frac{1}{N_B}\sum_{i=1}^{N_B}\left(\frac{\|\mathcal{M}_i - KH(\mathcal{M}_i, \Theta)\|_2^2}{\alpha_{i1}^2} + \frac{W(\mathcal{M}_i)}{\alpha_{i2}^2} + 2\log\alpha_{i1}\alpha_{i2}\right)$$

wherein $N_B$ is the number of NMR relaxation signals, $\mathcal{M}_\iota$ is the ι-th NMR relaxation signal, K is an inversion kernel matrix, $H(\mathcal{M}_\iota, \Theta)$ is a mapping relationship between the ι-th NMR relaxation signal $\mathcal{M}_\iota$ and the corresponding ι-th NMR relaxation time spectrum $F_\iota$, $\Theta$ is a weight of the neural network model, $W(\mathcal{M}_\iota)=\delta_\iota\|H(\mathcal{M}_\iota,\Theta)\|_1+(1-\delta_\iota)\|H(\mathcal{M}_\iota,\Theta)\|_2^2$, $\delta_\iota$ is a standard deviation of the ι-th NMR relaxation signal $\mathcal{M}_\iota$ in a range of (0, 1), and $\alpha_{\iota 1}$ and $\alpha_{\iota 2}$ are regularization parameters, $\|\ \|_1$ is 1-norm, and $\|\ \|_2^2$ is a square of 2-norm; and step 3, taking the samples in the training sample set as an input of the unsupervised neural network model, to obtain an optimal mapping relationship between the NMR relaxation signals and the NMR relaxation time spectrum with a minimum loss function.

The simulating inversion kernel matrix K as described above includes the following steps:

predefining echo signal parameters, the predefined echo signal parameters comprising a number of echo signals and an interval of sampling time points of two adjacent echo signals;

predefining NMR relaxation time parameters, the NMR relaxation time parameters comprising a range and number of predefined NMR relaxation times; and calculating the inversion kernel matrix K according to the echo signal parameters and the NMR relaxation time parameters.

The simulating continuous NMR relaxation time spectrum F as described above includes the following steps:

simulating the continuous NMR relaxation time spectrum F by randomly generating a plurality of Gaussian functions on a logarithmic scale with the full width half maxima of random peaks, random positions and random relative amplitudes, the full width half maxima of spectral peaks being between 0.1 and 1, and the positions of the spectral peaks varying from a maximum value to a minimum value of each of the predefined NMR relaxation times.

The unsupervised neural network model as described above includes a first sub-network including one input layer, four hidden layers and one output layer; and a second sub-network includes one input layer, two hidden layers and one output layer; the first sub-network and the second sub-network sharing the same input layer.

As described above, an activation function of the output layer of the first sub-network is a softmax function; and an activation function of the output layer of the second sub-network is a softplus function.

Compared with the prior art, the present invention has the following beneficial effects:

1. The training sample of the present invention does not need to be labeled, which provides the possibility of using experimental data as the sample for training.

2. The present invention can automatically learn the optimal regularization parameters, and does not depend on the initial value and manual experience.

3. The prediction model of the present invention has high prediction speed, which provides possibility for real-time online monitoring.

DETAILED DESCRIPTION OF THE EMBODIMENTS

Figure 1:
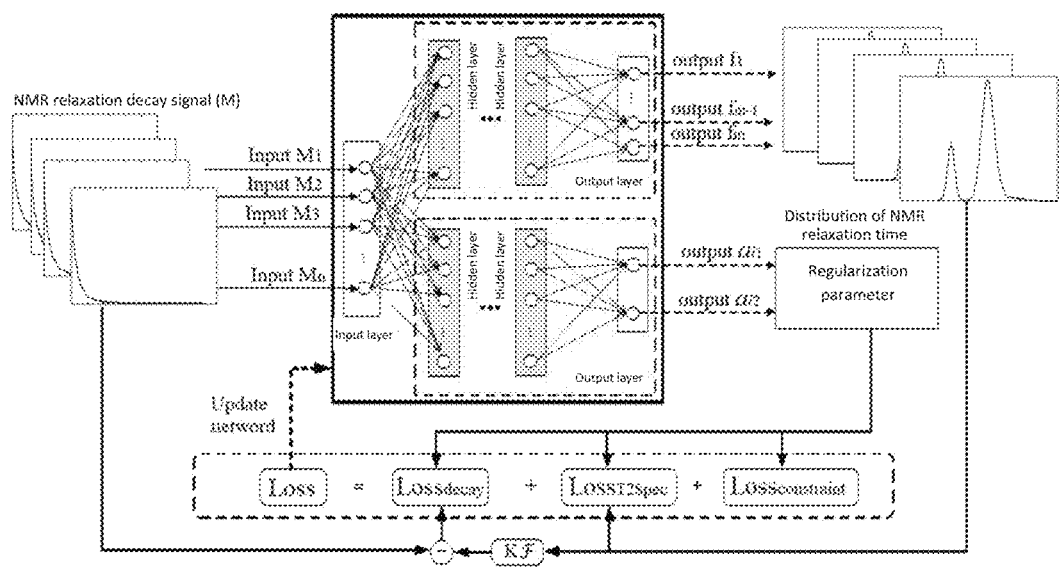
FIG. 1 is a structural diagram of an unsupervised neural network model.

In order to facilitate the understanding and practice of the present invention by those of ordinary skill in the art, the present invention is described in further detail below in connection with embodiments, and it should be understood that the examples of implementation described herein are intended to illustrate and explain the invention only and are not intended to limit the present invention.

The NMR relaxation time includes a transverse relaxation time and a longitudinal relaxation time. This embodiment is explained with the transverse relaxation time as an example, and the difference between the longitudinal relaxation time and the transverse relaxation time is only in the formula of the relaxation signal. The transverse relaxation signal is a decay signal (decreasing with time) and the longitudinal relaxation signal is a recovery signal (increasing with time). Inversion algorithms of longitudinal relaxation time $T_1$ spectrum and transverse relaxation time $T_2$ spectrum are consistent in mathematical principle, so $T_2$ is often taken as an example in discussing and studying multi-exponential inversion algorithms. Therefore, this embodiment is illustrated by the inversion of NMR transverse relaxation time $T_2$.

The simulated NMR relaxation signal is used as a sample, which in this embodiment is an NMR transverse relaxation multi-exponential decay signal. In this embodiment, the mathematical model of the NMR relaxation signal is expressed in Formula (1):

$$M(\tau) = \int f(T_2)\exp\left(-\frac{\tau}{T_2}\right)dT_2 + \varepsilon, \; f(T_2) \geq 0 \qquad \text{Formula (1)}$$

Where $\tau$ denotes an echo sampling time, $T_2$ denotes the NMR relaxation time, the NMR relaxation time in this embodiment is the NMR transverse relaxation time, $M(\tau)$ denotes the amplitude of the NMR relaxation signal, the amplitude of the NMR relaxation signal in this embodiment is an amplitude of the NMR transverse relaxation multi-exponential decay signal, $f(T_2)$ denotes a distribution of the NMR relaxation time $(T_2)$, i.e., corresponding to an NMR relaxation time spectrum F, and the NMR relaxation time spectrum F in this embodiment is the NMR transverse relaxation time spectrum, $\varepsilon$ denotes noise.

NMR relaxation time inversion refers to presetting a series of values of $\tau$, measuring a set of NMR relaxation signal intensities $M(\tau)$, and calculating a distribution $f(T_2)$ of the NMR relaxation time spectrum.

To solve the above problems, firstly, the formula (1) is discretized:

$$\mathcal{M} = KF + \varepsilon \qquad \text{Formula (2)}$$

where $$\mathcal{M} = \{M(\tau_i), i = 1, \ldots, n\}, F = \{f(T_{2\_j}), j = 1, \ldots, m\},$$

$$K = \left\{K_{ij} = \exp\left(-\frac{\tau_i}{T_{2\_j}}\right), i = 1, \ldots, n; j = 1, \ldots, m\right\}$$

K denotes an inversion kernel matrix, $\mathcal{M}$ denotes an NMR relaxation signal, F denotes a continuous NMR relaxation time spectrum, m denotes the number of predefined NMR relaxation times ($T_2$), j denotes the number of predefined NMR relaxation times ($T_2$), $T_{2\_j}$ denotes the j-th predefined NMR relaxation times ($T_2$), n denotes the number of echo signals, n denotes the number of the echo signals, $f(T_{2\_j})$ denotes the amplitude corresponding to the j-th predefined NMR relaxation times $T_{2\_j}$, and $\tau_i$ denotes the sampling time of the i-th echo. $M(\tau_i)$ denotes the amplitude of the i-th echo signal, which is the superposition of multiple single exponential echo signal amplitudes. In this embodiment, the amplitude of the single exponential echo signal is a amplitude of a single exponential decay echo signal.

Then, a mapping relationship H between $\mathcal{M}$ and F is calculated, as shown in Formula 3.

$$H: \mathcal{M} \rightarrow F \qquad \text{Formula (3)}$$

The inversion method provided by the present invention is implemented by an unsupervised depth neural network, and an unsupervised neural network model can be expressed as the following formula:

$$F = H(\mathcal{M}, \Theta) \qquad \text{Formula (4)}$$

The NMR relaxation signal $\mathcal{M}$ is an input of the unsupervised neural network model; the NMR relaxation time spectrum F is an output of the unsupervised neural network model; $\Theta$ is a weight of the unsupervised neural network model; and H is the mapping relationship between NMR relaxation signal and the NMR relaxation time spectrum.

An NMR relaxation time inversion method based on an unsupervised neural network, which includes:

Step 1. preparation of a training sample set and a test sample set

The simulated NMR relaxation signal is used as a sample, which in this embodiment is an NMR transverse relaxation multi-exponential decay signal, the samples are generated as follows:

1) simulating inversion kernel matrix K:

predefining echo signal parameters, in particular: the number n of predefined echo signals is 2048, TE is 0.2 ms, that is, the number of sampling time points of the echo signals is 2048, and an interval between sampling time points of adjacent two echo signals is 0.2 ms;

Predefining NMR relaxation time ($T_2$) parameters, the NMR relaxation time in this embodiment is the NMR transverse relaxation time, in particular: predefining the number m of the NMR relaxation time ($T_2$) to be 128, that is, 128 predefined NMR relaxation times $T_2$ are logarithmically distributed within an NMR relaxation time range of 0.1 ms to 1000 ms; and calculating the inversion kernel matrix K according to the set echo signal parameters and the NMR relaxation time parameters.

2) Simulating continuous NMR relaxation time spectrum F, where the NMR relaxation time spectrum F is the NMR transverse relaxation time spectrum: simulating the continuous NMR relaxation time spectrum F by randomly generating four Gaussian functions on a logarithmic scale with the full width half maxima of random peaks, random positions and random relative amplitudes. The full width half maxima of spectral peaks are between 0.1 and 1, and the positions of the spectral peaks vary from the maximum value to the minimum value of the 128 predefined NMR relaxation times $T_2$; and the amplitudes of the spectral peaks are normalized.

3) Simulating noise $\varepsilon$ (signal-to-noise ratio is randomly generated between 10 and 80), and the noise e is Rayleigh noise. According to $\mathcal{M} = KF + \varepsilon$, the NMR relaxation signal $\mathcal{M}$ containing noise can be calculated as a sample, and various sample constitutes a sample set, which is divided into a training sample set and a test sample set.

In this embodiment, the total number of samples in the training sample set is 50,000.

Step 2. establishment of an unsupervised depth neural network model

The unsupervised neural network model established in this embodiment consists of two sub-networks, namely, a first sub-network and a second sub-network. As shown in FIG. 1, the first sub-network includes one input layer, four hidden layers and one output layer; and the second sub-network includes one input layer, two hidden layers and one output layer. The first sub-network and the second sub-network share the same input layer, and the number of neurons in the input layer is 2,048. In the first sub-network, there are 2,048 neurons in each hidden layer and 128 neurons in the output layer. In the second sub-network, there are 2,048 neurons in each hidden layer and 2 neurons in the output layer. An activation function of the hidden layer of the first sub-network and the second sub-network is a Rectified Linear Unit (ReLU). The activation function of the output layer in the first sub-network is a softmax function; and the activation function of the output layer in the second sub-network is a softplus function.

The training process of the unsupervised neural network is the process of determining the weight $\Theta$ of neural network model by minimizing the predefined loss function.

The predefined loss function of the unsupervised neural network model established in this embodiment is:

$$\frac{1}{N_B} \sum_{i=1}^{N_B} \left( \frac{\|\mathcal{M}_i - KH(\mathcal{M}_i, \Theta)\|_2^2}{\alpha_{i1}^2} + \frac{W(\mathcal{M}_i)}{\alpha_{i2}^2} + 2\log \alpha_{i1} \alpha_{i2} \right)$$

where $N_B$ is the number of NMR relaxation signals, $\mathcal{M}_i$ is the i-th NMR relaxation signal, K is an inversion kernel matrix, $H(\mathcal{M}_i, \Theta)$ is a mapping relationship between the i-th NMR relaxation signal $\mathcal{M}_i$ and the corresponding i-th NMR relaxation time spectrum $F_i$, $\Theta$ is a weight of the neural network model, $W(\mathcal{M}_i) = \delta_i \|H(\mathcal{M}_i, \Theta)\|_1 + (1-\delta_i) \|H(\mathcal{M}_i, \Theta)\|_2^2$, $\delta_i$ is a standard deviation of the i-th NMR relaxation signal $\mathcal{M}_i$ in a range of (0, 1). $\alpha_{i1}$ and $\alpha_{i2}$ are regularization parameters, output results of the second network: $\|\ \|_1$ is 1-norm; and $\|\times\|_2^2$ is a square of 2-norm.

The first term in the loss function:

$$\frac{\|\mathcal{M}_i - KH(\mathcal{M}_i, \Theta)\|_2^2}{\alpha_{i1}^2},$$

is the fidelity loss term of the NMR relaxation signal. Fidelity loss is defined according to the forward physical model and data noise characteristics. Fidelity term is used to restrict the consistency between network output and measurement data.

The second term in the loss function:

$$\frac{W(\mathcal{M}_i)}{\alpha_{i2}^2},$$

is a continuity constraint term of the NMR relaxation time spectrum of the network output.

The third term in the loss function: $2\log\alpha_{i1}\alpha_{i2}$, is a regularization parameter term, which is a balance term between the first term and the second term of the loss function.

Step 3, training of the unsupervised neural network model

The input of the unsupervised neural network model is the samples in the training sample set. The unsupervised neural network model established in the step 2 is trained to self-learn the optimal regular parameters $\alpha_{i1}$ and $\alpha_{i2}$, and self-learn the optimal mapping relationship between the NMR relaxation signal and the NMR relaxation time spectrum. For all the samples in the training sample set, the loss function is minimized, that is, the optimal mapping relationship is obtained. The trained unsupervised neural network model is called predictive model T2Inversion-UTD.

In this embodiment, before training the unsupervised neural network model, the hyper parameters of the unsupervised neural network model are set as follows: a batch size of learning is 2; initial bias vectors of the input layer, each hidden layer and the last output layer are all zero, and an iteration epoch is 2,000. The iterative algorithm adopts adaptive moment estimation algorithm (Adam) with a learning rate of 1e-5.

Step 4, inversion

The samples in the test sample set are input into the prediction model T2Inversion-UTD learned in step 3 for prediction, and the corresponding calculated NMR relaxation time spectrum is output.

Figure 2A:
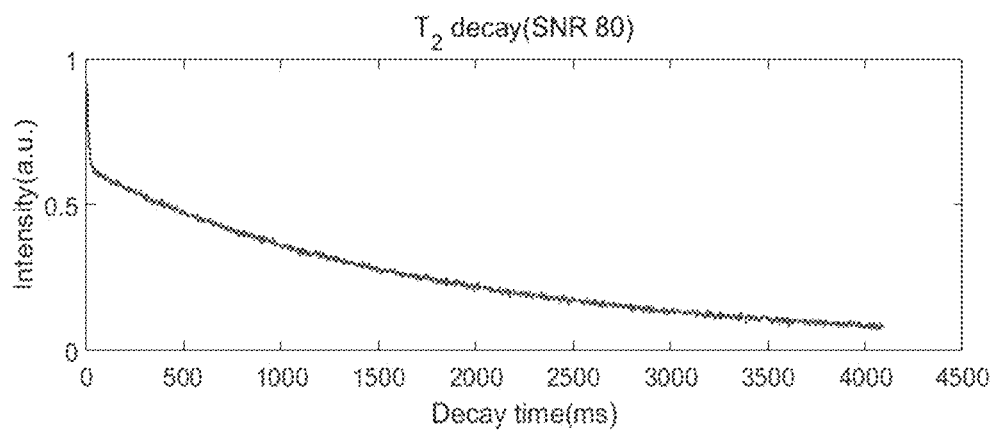
FIG. 2A is a simulated NMR transverse relaxation multi-exponential decay signal with a narrow peak width of NMR transverse relaxation time spectrum.
Figure 2B:
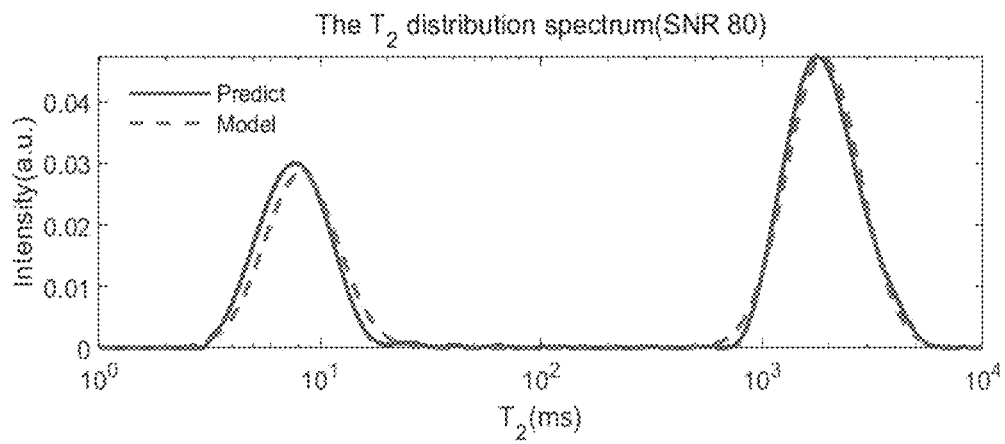
FIG. 2B is a contrast diagram of the NMR transverse relaxation time spectrum (solid line) predicted by the prediction model and the corresponding simulated continuous NMR transverse relaxation time spectrum (dashed line) by inputting the NMR transverse relaxation multi-exponential decay signal in FIG. 2A to the prediction model.
Figure 3A:
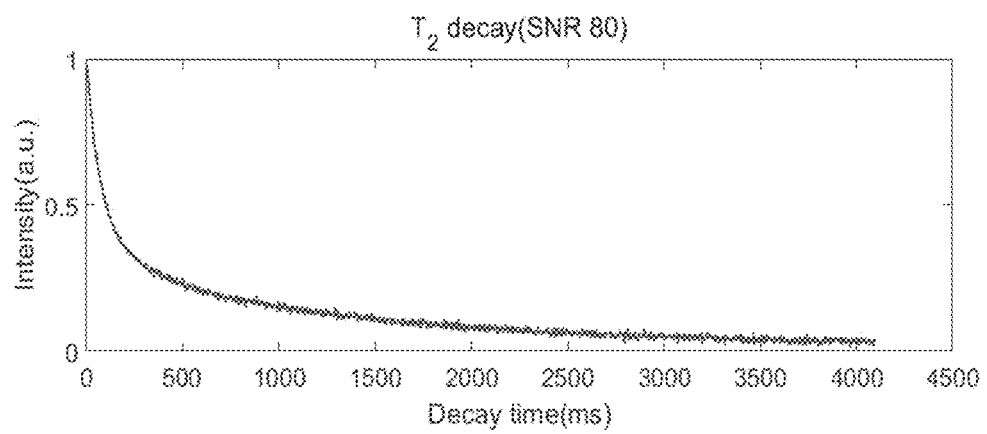
FIG. 3A is a simulated NMR transverse relaxation multi-exponential decay signal with a wide peak width of NMR transverse relaxation time spectrum.
Figure 3B:
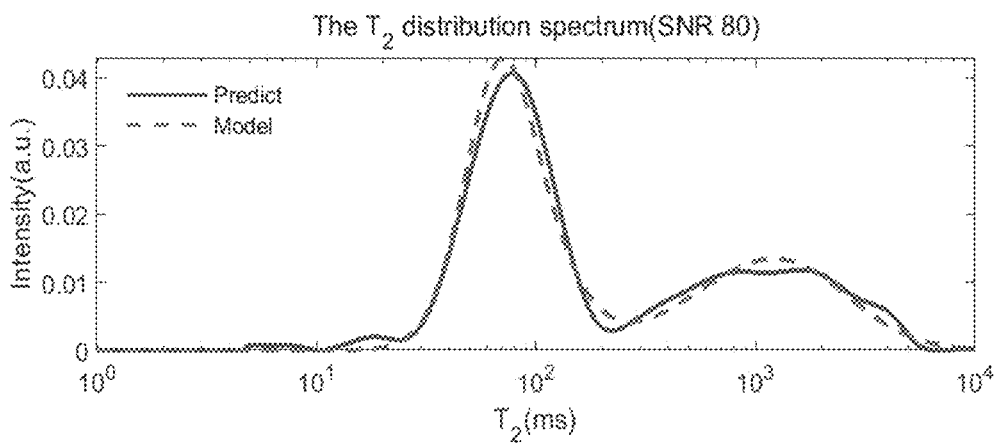
FIG. 3B is a contrast diagram of the NMR transverse relaxation time spectrum (solid line) predicted by the prediction model and the corresponding simulated continuous NMR transverse relaxation time spectrum (dashed line) by inputting the NMR transverse relaxation multi-exponential decay signal in FIG. 3A to the prediction model.

FIG. 2A is a simulated NMR transverse relaxation multi-exponential decay signal with a narrow peak width of NMR transverse relaxation time spectrum;

FIG. 3A is a simulated NMR transverse relaxation multi-exponential decay signal with a wide peak width of NMR transverse relaxation time spectrum; and FIG. 2B is a contrast diagram of the NMR transverse relaxation time spectrum (solid line) predicted by the prediction model and the corresponding simulated continuous NMR transverse relaxation time spectrum (dashed line) by inputting the NMR transverse relaxation multi-exponential decay signal in FIG. 2A to the prediction model;

FIG. 3B is a contrast diagram of the NMR transverse relaxation time spectrum (solid line) predicted by the prediction model and the corresponding simulated continuous NMR transverse relaxation time spectrum (dashed line) by inputting the NMR transverse relaxation multi-exponential decay signal in FIG. 3A to the prediction model. The simulated NMR transverse relaxation decay signal in FIG. 2A is a signal with a narrow peak width of the NMR transverse relaxation time spectrum, and the simulated NMR transverse relaxation decay signal in FIG. 3A is a signal with a wide peak width of the NMR transverse relaxation time spectrum.

It can be seen from the experimental results that the method of the present invention can better determine the width and position of the NMR transverse relaxation time spectrum peak under a certain signal-to-noise ratio condition.

On the computer equipped with GTX1080Ti, the total prediction time for the 629 samples in the test sample set was 1.03125s, and the prediction time for one sample was 1.6395 ms.

The specific embodiments described herein are merely illustrative of the spirit of the present invention. Those skilled in the art to which the present invention pertains may make various modifications or additions to or similarly replace the detailed embodiments described without departing from the spirit of the present invention or exceeding the scope defined by the appended claims.

What is claimed is:

1. An NMR relaxation time inversion method based on an unsupervised neural network, wherein the NMR relaxation time inversion method comprises:

step 1, simulating an inversion kernel matrix K, simulating a continuous NMR relaxation time spectrum F, simulating noise ε, calculating NMR relaxation signals $\mathcal{M}$ according to $\mathcal{M}$ =KF+ε as samples, various samples forming a sample set, and dividing the sample set into a training sample set and a test sample set;

step 2, constructing an unsupervised neural network model, and defining a loss function of the unsupervised neural network model as:

$$\frac{1}{N_B}\sum_{i=1}^{N_B}\left(\frac{\|\mathcal{M}_i - KH(\mathcal{M}_i,\Theta)\|_2^2}{\alpha_{i1}^2} + \frac{W(\mathcal{M}_i)}{\alpha_{i2}^2} + 2\log\alpha_{i1}\alpha_{i2}\right)$$

where $N_B$ is a number of the NMR relaxation signals, $\mathcal{M}_i$ is an ι-th NMR relaxation signal, K is the inversion kernel matrix, $H(\mathcal{M}_i,\Theta)$ is a mapping relationship between the ι-th NMR relaxation signal $\mathcal{M}_i$ and the corresponding ι-th NMR relaxation time spectrum $F_i$, $\Theta$ is a weight of the unsupervised neural network model, $W(\mathcal{M}_i)=\delta_i\|H(\mathcal{M}_i,\Theta)\|_1+(1-\delta_i)\|H(\mathcal{M}_i,\Theta)\|_2^2$, $\delta_i$ is a standard deviation of the ι-th NMR relaxation signal $\mathcal{M}_i$ in a range of (0, 1), and $\alpha_{i1}$ and $\alpha_{i2}$ are regularization parameters, $\|\ \|_1$ is 1-norm, and $\|\ \|_2^2$ is a square of 2-norm; and step 3, taking the samples in the training sample set as an input of the unsupervised neural network model, to obtain an optimal mapping relationship between the NMR relaxation signals and the continuous NMR relaxation time spectrum with a minimum loss function.

2. The NMR relaxation time inversion method based on the unsupervised neural network according to claim 1, wherein the simulating the inversion kernel matrix K comprises:

predefining echo signal parameters, the echo signal parameters predefined comprising a number of echo signals and an interval of sampling time points of two adjacent echo signals;

predefining NMR relaxation time parameters, the NMR relaxation time parameters comprising a range and a number of predefined NMR relaxation times; and calculating the inversion kernel matrix K according to the echo signal parameters and the NMR relaxation time parameters.

3. The NMR relaxation time inversion method based on the unsupervised neural network according to claim 1, wherein the simulating the continuous NMR relaxation time spectrum F comprises:

simulating the continuous NMR relaxation time spectrum F by randomly generating a plurality of Gaussian functions on a logarithmic scale with full width half maxima of random peaks, random positions and random relative amplitudes, full width half maxima of spectral peaks being between 0.1 and 1, and positions of the spectral peaks varying from a maximum value to a minimum value of each of predefined NMR relaxation times.

4. The NMR relaxation time inversion method based on the unsupervised neural network according to claim 1, wherein the unsupervised neural network model comprises a first sub-network comprising one input layer, four hidden layers and one output layer; and a second sub-network comprising one input layer, two hidden layers and one output layer; the first sub-network and the second sub-network sharing the same input layer.

5. The NMR relaxation time inversion method based on the unsupervised neural network according to claim 4, wherein an activation function of the one output layer of the first sub-network is a softmax function; and an activation function of the one output layer of the second sub-network is a softplus function.

\* \* \* \* \*